(12) United States Patent
Zhang et al.

(10) Patent No.: US 10,847,627 B2
(45) Date of Patent: Nov. 24, 2020

(54) SEMICONDUCTOR DEVICE HAVING SOURCE FIELD PLATE AND METHOD OF MANUFACTURING THE SAME

(71) Applicant: Dynax Semiconductor, Inc., Kunshan (CN)

(72) Inventors: Naiqian Zhang, Kunshan (CN); Feihang Liu, Kunshan (CN); Xin Jin, Kunshan (CN); Yi Pei, Kunshan (CN); Xi Song, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 0 days.

(21) Appl. No.: 15/045,931

(22) Filed: Feb. 17, 2016

(65) Prior Publication Data

US 2016/0380062 A1 Dec. 29, 2016

(30) Foreign Application Priority Data

Jun. 26, 2015 (CN) .......................... 2015 1 0363973

(51) Int. Cl.
*H01L 29/40* (2006.01)
*H01L 29/778* (2006.01)
*H01L 29/66* (2006.01)
*H01L 29/20* (2006.01)

(52) U.S. Cl.
CPC .......... *H01L 29/407* (2013.01); *H01L 29/402* (2013.01); *H01L 29/66431* (2013.01); *H01L 29/7786* (2013.01); *H01L 29/2003* (2013.01)

(58) Field of Classification Search
CPC .................................................. H01L 29/402
USPC ........................................................ 257/409
See application file for complete search history.

(56) References Cited

U.S. PATENT DOCUMENTS 9,761,675 B1* 9/2017 Marinella ............. H01L 29/405
2006/0220150 A1* 10/2006 Nishi ................... H01L 23/4827
257/382
2008/0108189 A1* 5/2008 Tabatabaie ............ H01L 29/402
438/197

FOREIGN PATENT DOCUMENTS

CN 104157691 A * 11/2014

OTHER PUBLICATIONS

Machine translation of Liu et al. (CN-104157691-A), Nov. 19, 2014 (Year: 2014).*

* cited by examiner

*Primary Examiner* — Hsin Yi Hsieh
(74) *Attorney, Agent, or Firm* — Flener IP & Business Law; Zareefa B. Flener

(57) ABSTRACT

A semiconductor device comprises: a substrate; a semiconductor layer formed on the substrate; a source electrode, a drain electrode and a gate electrode between the source electrode and the drain electrode formed on the semiconductor layer; and a source field plate formed on the semiconductor layer. The source field plate sequentially comprises: a start portion electrically connected to the source electrode; a first intermediate portion spaced apart from the semiconductor layer with air therebetween; a second intermediate portion disposed between the gate electrode and the drain electrode in a horizontal direction, without air between the second intermediate portion and the semiconductor layer; and an end portion spaced apart from the semiconductor layer with air therebetween.

12 Claims, 9 Drawing Sheets

SEMICONDUCTOR DEVICE HAVING SOURCE FIELD PLATE AND METHOD OF MANUFACTURING THE SAME

CROSS-REFERENCE TO RELATED APPLICATIONS

The present application claims priority under 35 U.S.C. § 119 to Chinese Patent Application No. 201510363973.6, filed on Jun. 26, 2015, in the State Intellectual Property Office of China, which is incorporated by reference herein in its entirety.

TECHNICAL FIELD

Embodiments of the present invention relate to a semiconductor device and a method of manufacturing the semiconductor device.

BACKGROUND

In a High Electron Mobility Transistor (HEMT) device working under a high drain-source voltage, dense electric field lines are formed at an end of a gate electrode which is adjacent to a drain electrode, thus a high electric field peak is generated. Such a high electric field in a local region may result in a very large gate electrode leak current, and even lead to material breakdown and device failure, thus reducing a breakdown voltage of the device. The higher the electric field peak is, the smaller the bearable breakdown voltage of the device is. Meanwhile, as time passes, a dielectric layer or a semiconductor layer at a surface of the device may be degraded or denatured due to the high electric field, which reduces reliability and lifetime of the device. In this case, advantages of an HEMT device, e.g. being resistant of high temperature, high pressure and high frequency, are affected greatly. Therefore, in structure design and process development for a semiconductor device, it is required to reduce the electric field near the gate electrode so as to improve the breakdown voltage and thus reliability of the device.

SUMMARY

Aspects of the present invention are directed to a semiconductor device with improved reliability and performance and a method of manufacturing such a semiconductor device.

According to an aspect of the present invention, a semiconductor device comprises: a substrate; a semiconductor layer formed on the substrate; a source electrode, a drain electrode and a gate electrode between the source electrode and the drain electrode formed on the semiconductor layer; and a source field plate formed on the semiconductor layer. The source field plate sequentially comprises: a start portion electrically connected to the source electrode; a first intermediate portion spaced apart from the semiconductor layer with air therebetween; a second intermediate portion disposed between the gate electrode and the drain electrode in a horizontal direction, without air between the second intermediate portion and the semiconductor layer; and an end portion spaced apart from the semiconductor layer with air therebetween.

According to another aspect of the present invention, a method of manufacturing a semiconductor device comprises: forming a semiconductor layer on a prepared substrate; forming a source electrode, a drain electrode and a gate electrode between the source electrode and the drain electrode on the semiconductor layer; and forming a source field plate on the semiconductor layer, the source field plate sequentially comprising: a start portion electrically connected to the source electrode; a first intermediate portion spaced apart from the semiconductor layer with air therebetween; a second intermediate portion disposed between the gate electrode and the drain electrode in a horizontal direction, without air between the second intermediate portion and the semiconductor layer; and an end portion spaced apart from the semiconductor layer with air therebetween.

According to embodiments of the present invention, the first intermediate portion of the source field plate has an air bridge structure, in which air exists between the first intermediate portion and the semiconductor layer, which reduces parasitic gate-source capacitance and parasitic resistance. Meanwhile, the end portion of the source field plate is spaced apart from the semiconductor layer with air therebetween, which further reduces the parasitic gate-source capacitance and the parasitic resistance.

Furthermore, there is no air between the second intermediate portion of the source field plate and the semiconductor layer, thus the distance from the second intermediate portion to the strong electric field region near the gate electrode is not reduced, so the effect of modulation to the strong electric field by the source field plate is not or substantially not weakened.

In addition, in the above-described manufacturing method, the groove may be formed using the air bridge self-aligned lithography and etching process. With such a process, the position of the groove with respect to the semiconductor layer is automatically aligned with the positions of the source field plate and the gate source, which avoids alignment deviation caused by a separate lithography process forming the groove, thus improves yield and reduces manufacture costs.

BRIEF DESCRIPTION OF DRAWINGS

These and/or other aspects will become apparent and more readily appreciated from the following description of the embodiments, taken in conjunction with the accompanying drawings in which.

DETAILED DESCRIPTION

Figure 1:
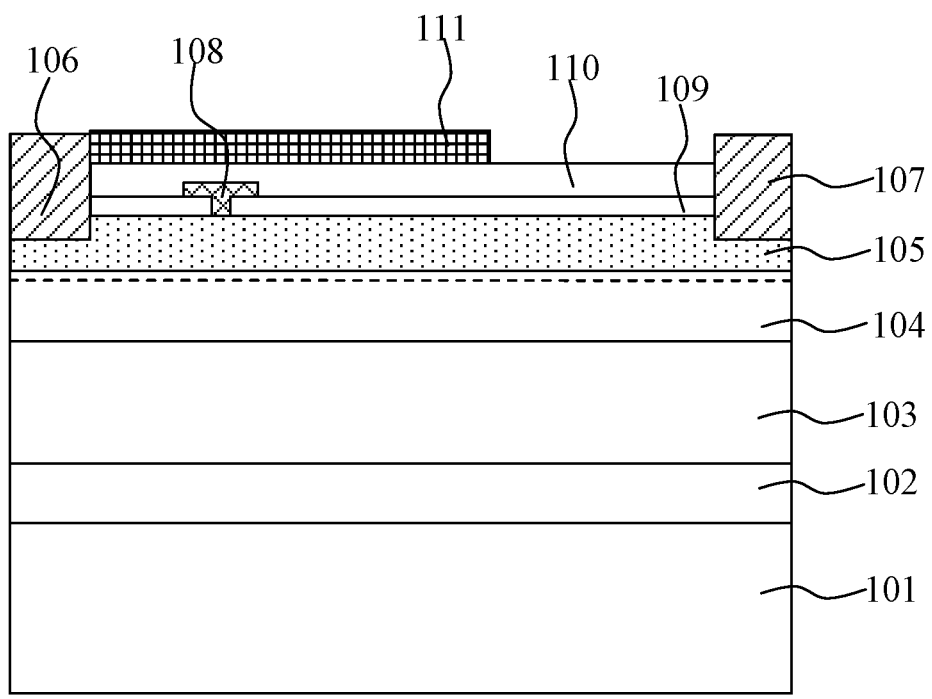
FIG. 1 is a cross-sectional view schematically illustrating a semiconductor device according to the prior art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween.

In order to reduce strength of an electric field near a gate electrode of a semiconductor device, usage of field plates is widely employed. In detail, a field plate is disposed at an end of the gate electrode which is adjacent to a drain electrode and is connected to a source electrode or the gate electrode. In this way, an additional potential is generated in a gate-drain region, an area of a depletion region is increased, and a bearable voltage of the depletion region is increased. In addition, the field plate modulates dense electric field lines near the end of the gate electrode which is adjacent to the drain electrode to make distribution of the electric field lines more uniform, which decreases the strength of the electric field near the end of the gate electrode which is adjacent to the drain electrode, reduces gate electrode leak current and improves breakdown voltage of the device.

FIG. 1 is a cross-sectional view schematically illustrating a semiconductor device according to the prior art. As shown in FIG. 1, a semiconductor device comprises: a substrate 101; a nucleation layer 102, a buffer layer 103, a channel layer 104 and a barrier layer 105 sequentially stacked on the substrate 101; a source electrode 106 and a drain electrode 107 formed on the barrier layer 105, and a gate electrode 108 between the source electrode 106 and the drain electrode 107; a first dielectric layer 109 formed on a part of the barrier layer 105 between the source electrode 106 and the gate electrode 108 and another part of the barrier layer 105 between the gate electrode 108 and the drain electrode 107; a second dielectric layer 110 formed on the gate electrode 108 and the first dielectric layer 109; and a source field plate 111 formed on the second dielectric layer 110 and connected to the source electrode 106. An additional potential may be generated in the gate-drain region due to the source field plate 111, thus an electric field peak near an end of the gate electrode 108 which is adjacent to the drain electrode 107 can be effectively suppressed, thereby improving breakdown voltage and reliability of the device.

However, in the semiconductor device described as above, the source field plate 111 directly covers the second dielectric layer 110, the metal of the source field plate 111 having a large area completely overlaps the underlying gate electrode 108 and two-dimensional electron gas in a channel, thus parasitic gate-source capacitance Cgs is generated. The parasitic gate-source capacitance Cgs is inversely proportional to a distance between the source field plate 111 and the gate electrode 108, and is proportional to the overlapping area between the source field plate 111 and the gate electrode 108. In addition, the dielectric constant of the dielectric layer is relatively large, so a large parasitic gate-source capacitance Cgs will be generated during operation of the device, resulting in deterioration of the frequency characteristics of the device. Further, the source field plate 111 is generally connected to the lowest potential, which affects distribution of the two-dimensional electron gas below the source field plate 111 so that the two-dimensional electron gas is expanded to the channel layer. In this way, concentration of the two-dimensional electron gas in the channel is reduced, resulting in generation of parasitic resistance, so on-resistance is increased during operation of the device.

In order to reduce the parasitic gate-source capacitance Cgs and the parasitic resistance, a thickness of the dielectric layer can be increased. However, increase of the thickness of the dielectric layer will result in increase of distance between the source field plate 111 and the region with a strong electric field, which reduces the effect of modulation to the strong electric field. In addition, the process will become difficult if the dielectric layer is excessive thick, and often the thickness of the dielectric layer is specially designed and cannot be changed randomly.

In view of this, embodiments of the present invention provide a semiconductor device having reduced parasitic gate-source capacitance Cgs and reduced parasitic resistance while maintaining the effect of the modulation to the strong electric field.

Hereinafter semiconductor devices according to exemplary embodiments of the present invention will be described in detail with reference to FIGS. 2-12.

Figure 2:
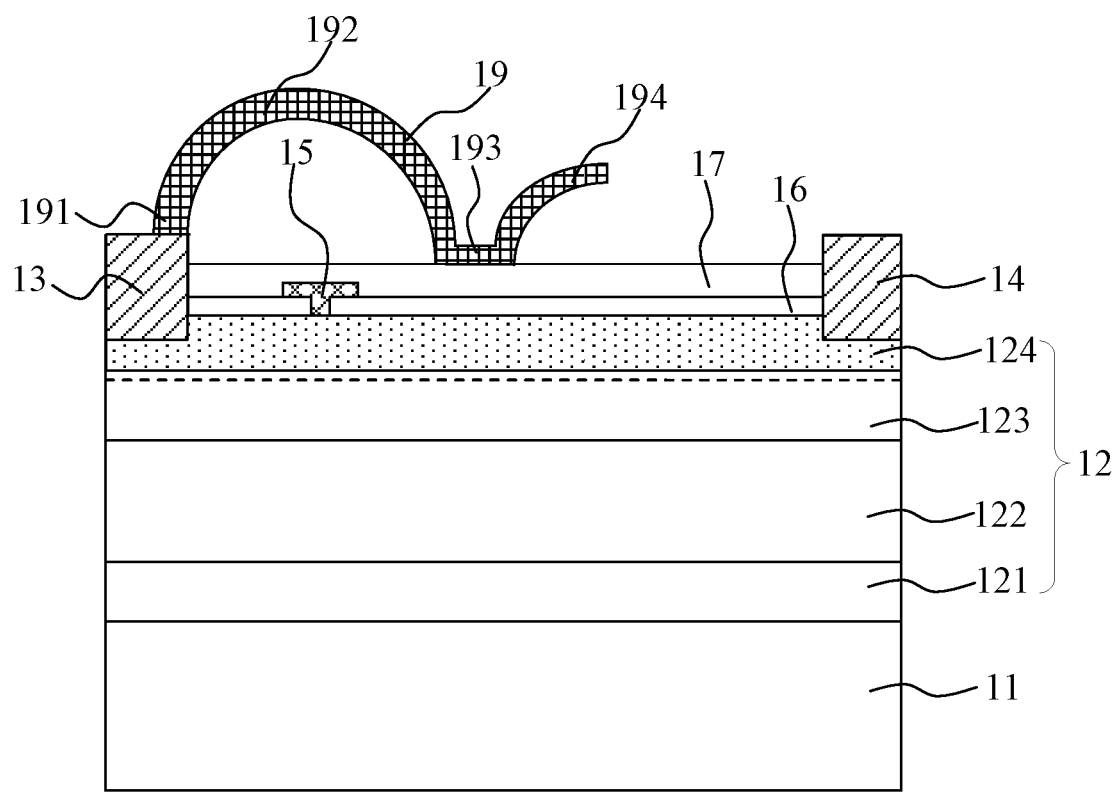
FIGS. 2-10 are cross-sectional views schematically illustrating semiconductor devices according to various exemplary embodiments of the present invention.

FIG. 2 is a cross-sectional view schematically illustrating a semiconductor device according to an exemplary embodiment of the present invention.

As shown in FIG. 2, a semiconductor device comprises: a substrate 11; a semiconductor layer 12 formed on the substrate 11; a source electrode 13, a drain electrode 14 and a gate electrode 15 between the source electrode 13 and the drain electrode 14 formed on the semiconductor layer 12; and a source field plate 19 formed on the semiconductor layer 12.

The source field plate 19 sequentially comprises a start portion 191 electrically connected to the source electrode 13, a first intermediate portion 192 formed on the semiconductor layer 12 with air therebetween, a second intermediate portion 193 contacting a portion of the semiconductor layer 12 between the gate electrode 15 and the drain electrode 14, and an end portion 194 formed on the semiconductor layer 12 with air therebetween. Since the second intermediate portion 193 is in direct contact with the semiconductor layer 12, it means that no air exists between the second intermediate portion 193 and the semiconductor layer 12. The source field plate 19 is made by an air bridge metal process using a metallic material. The thickness of the source field plate 19 can be determined and adjusted based on design requirements or process capability.

In an embodiment, the substrate 11 is formed of a material selected from a group consisting of gallium nitride, aluminum gallium nitride, indium gallium nitride, indium aluminum gallium nitride, indium phosphide, gallium arsenide, silicon carbide, diamond, sapphire, germanium, silicon and combination thereof, or any other material which is capable of growing group III nitride.

The semiconductor layer 12 may be formed of a semiconductor material based on III-V group compounds. The semiconductor layer 12 may include a nucleation layer 121 formed on the substrate 11. The nucleation layer 121 affects parameters, such as crystal quality, surface morphology and electrical properties, of heterojunction material located thereon, and acts as matching substrate material and semiconductor material layer in the heterojunction structure.

The semiconductor layer 12 may further comprise a buffer layer 122 formed on the nucleation layer 121. The buffer layer 122 protects the substrate 11 from metal ions, and acts as bonding another semiconductor material layer grown thereon. The buffer layer 122 may be formed of one selected from AlGaN, GaN, AlGaInN and other III-nitride material.

The semiconductor layer 12 may further comprise a channel layer 123 formed on the buffer layer 122 and a barrier layer 124 formed on the channel layer 123. The barrier layer 124 may be made of AlGaN. The channel layer 123 and the barrier layer 124 form a heterojunction structure together, a Two-Dimensional Electron Gas (2DEG) channel is formed at an interface of the heterojunction structure, as shown by the dotted line in FIG. 2. Here, the channel layer 123 provides a channel for movement of 2DEG, and the barrier layer 124 acts as a barrier.

The source electrode 13 and the drain electrode 14 on the barrier layer 124 are in contact with the 2DEG respectively. The gate electrode 15 is located on the barrier layer 124 and between the source electrode 13 and the drain electrode 14, and may be a T shaped gate. When the gate electrode 15 is applied with an appropriate bias voltage, a current flows between the source electrode 13 and the drain electrode 14 through the 2DEG channel between the channel layer 123 and the barrier layer 124.

The semiconductor device may further include a dielectric layer formed on the semiconductor layer 12. In this case, the second intermediate portion 193 of the source field plate 19 is in direct contact with the dielectric layer. The dielectric layer may include a first dielectric layer 16 formed on the semiconductor layer 12 and a second dielectric layer 17 formed o the first dielectric layer 16. In this case, the second intermediate portion 193 of the source field plate 19 is in direct contact with the second dielectric layer 17, as shown in FIG. 2.

According to this embodiment, the first intermediate portion 192 of the source field plate 19 has an air bridge structure, in which the first intermediate portion 192 is not in direct contact with the dielectric layer on the gate electrode 15, the source-gate region and a part of the gate-drain region. Instead, the first intermediate portion 192 is spaced apart from the dielectric layer and air having a very small dielectric constant exists therebetween, which reduces parasitic gate-source capacitance and parasitic resistance. Meanwhile, the end portion 194 of the source field plate 19 is not in contact with the dielectric layer on the gate-drain region, which further reduces the parasitic gate-source capacitance and the parasitic resistance.

Furthermore, the second intermediate portion 193 of the source field plate 19 is in direct contact with the dielectric layer, thus the distance from the second intermediate portion 193 to the strong electric field region near the gate electrode 15 is not reduced, so the effect of modulation to the strong electric field by the source field plate 19 is not or substantially not weakened.

In another embodiment, the dielectric layer may include only the first dielectric layer 16, without the second dielectric layer 17. In this case, the second intermediate portion 193 is in direct contact with the first dielectric layer 16.

The dielectric layer acts as passivation and protection for the surface of the device, and may be formed of any one selected from SiN, $SiO_2$, SiON, $Al_2O_3$, $HfO_2$, HfAlOx and combination thereof.

Figure 3:
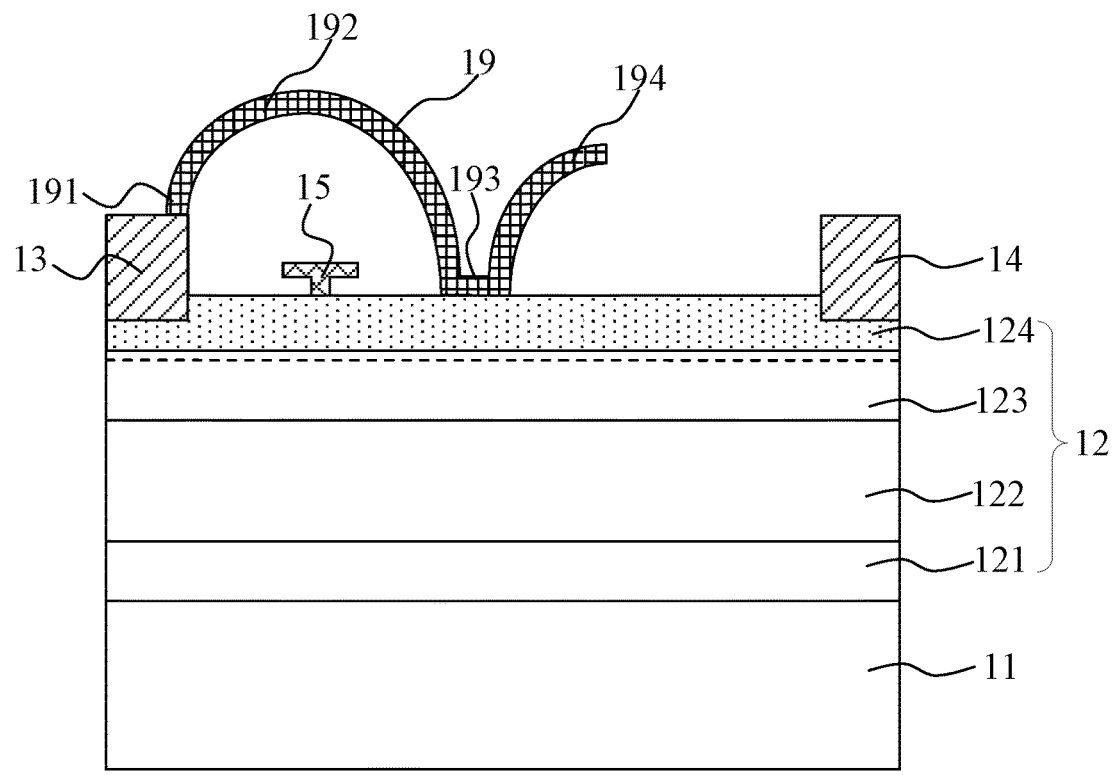

In yet another embodiment, as shown in FIG. 3, the dielectric layer may be omitted. In this case, the second intermediate portion 193 is in direct contact with the barrier layer 124, i.e., in direct contact with the semiconductor layer 12.

Figure 4:
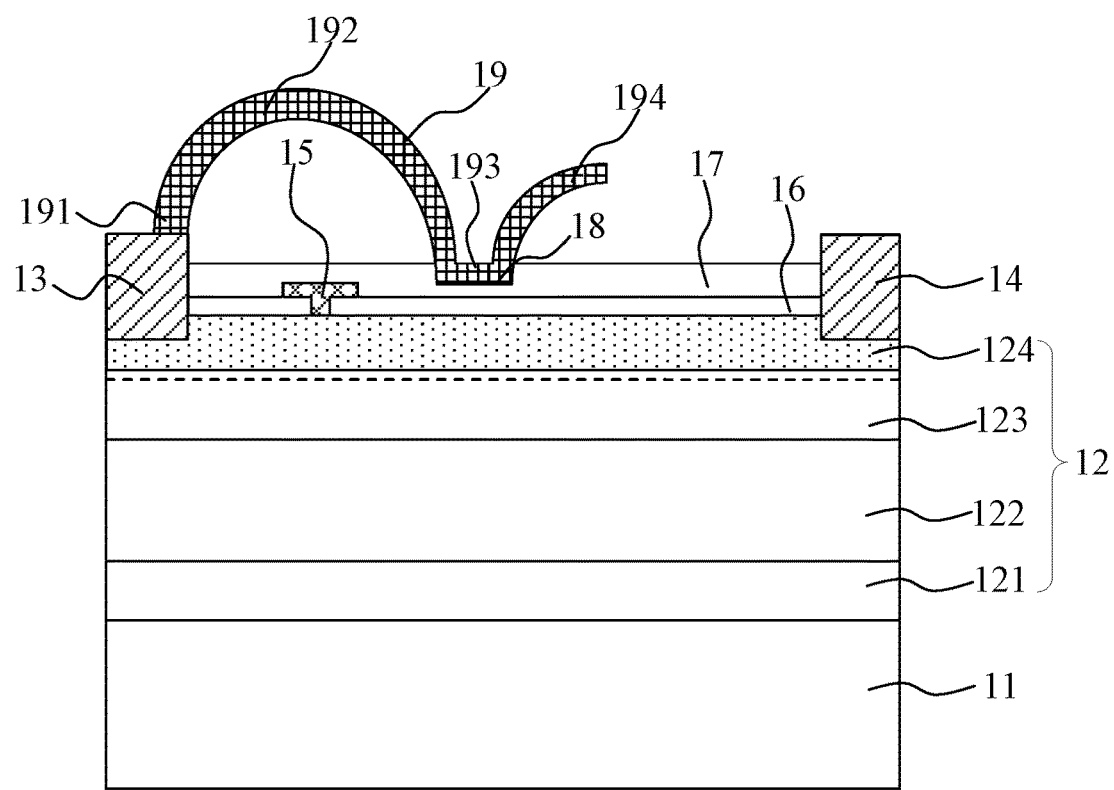

FIG. 4 is a cross-sectional view schematically illustrating a semiconductor device according to another exemplary embodiment of the present invention. The semiconductor device shown in FIG. 4 is substantially the same as that shown in FIG. 2, except for a groove, thus repeated description will be omitted.

As shown in FIG. 4, in order to further strengthen the effect of modulation to the strong electric field by the source field plate 19, a groove 18 is formed at a position in the dielectric layer corresponding to the position of the second intermediate portion 193 of the source field plate 19 in the horizontal direction, so that the second intermediate portion 193 of the source field plate 19 is located in the groove 18. As an example, the dielectric layer comprises the first dielectric layer 16 and the second dielectric layer 17, and the groove 18 is formed in the second dielectric layer 17. In this way, the second intermediate portion 193 is closer to the strong electric field region, compared with the embodiment shown in FIG. 2, so the strong electric field can be modulated more effectively.

Figure 5:
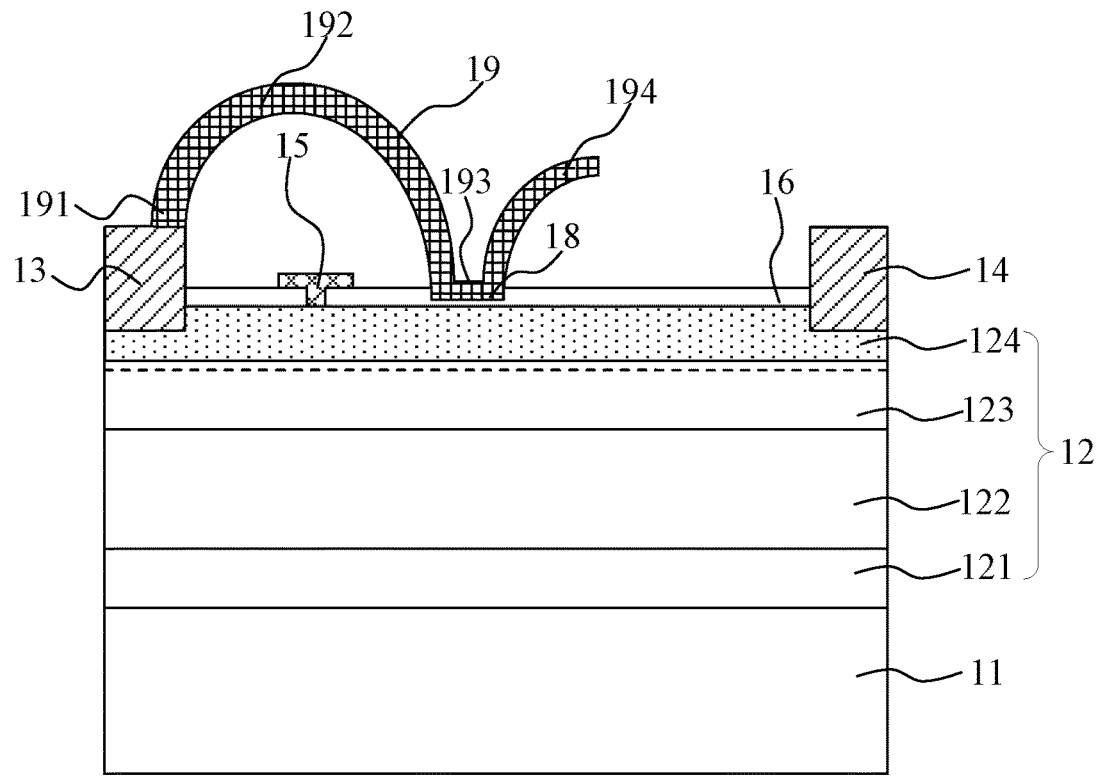

As another example, the dielectric layer may comprise the first dielectric layer 16 only, without the second dielectric layer 17. In this case, as shown in FIG. 5, the groove 18 is formed in the first dielectric layer 16. Compared with the embodiment shown in FIG. 4, the second dielectric layer 17 is omitted, it means that a portion of the second dielectric layer 17 on the gate region, the source-gate region and a part of the gate-drain region is replaced with air having the same thickness, which can further reduce the parasitic capacitance and parasitic resistance. Meanwhile, the groove 18 is etched in the first dielectric layer 16, thus the second intermediate portion 193 located in the groove 18 is closer to the strong electric field region, compared with the embodiment shown in FIG. 4, therefore the electric field in the region between the gate electrode 15 and the drain electrode 14 can be modulated more effectively.

Figure 6:
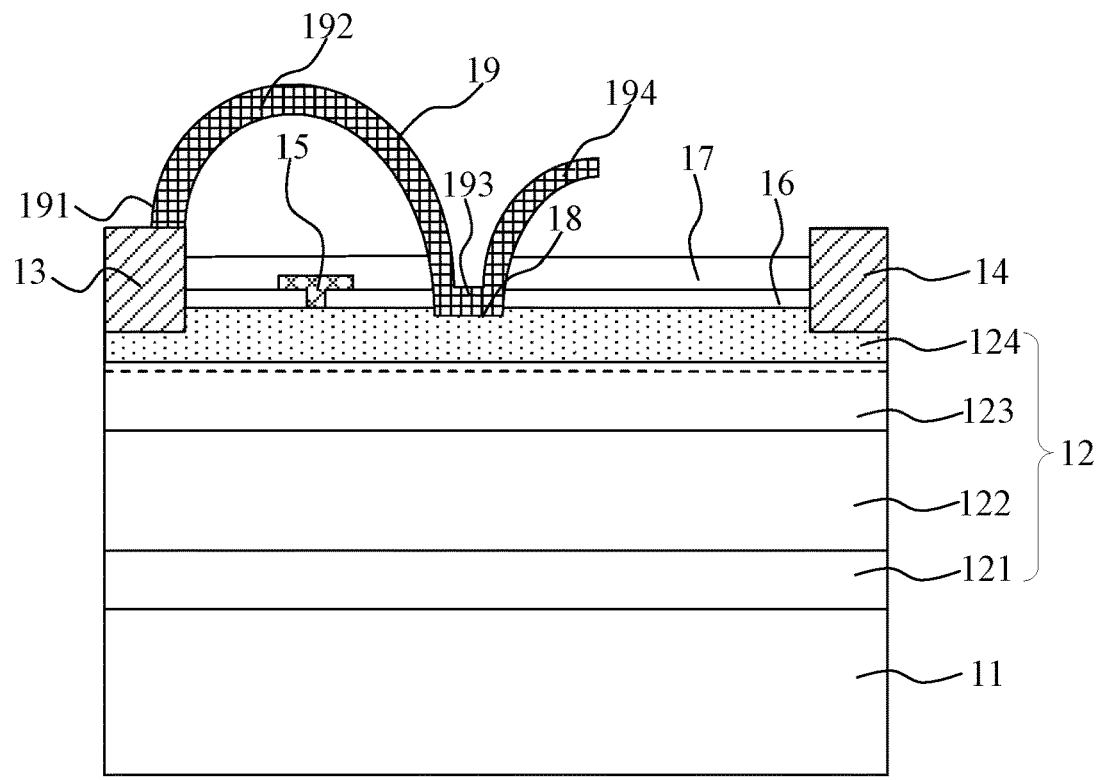

If intensity of the electric field near an end of the gate electrode 15 which is adjacent to the drain electrode 14 is very large, the etching depth of the groove 18 can be increased to achieve better modulation effect. Referring to FIG. 6, the semiconductor device comprises the first dielectric layer 16 formed on the semiconductor layer 12 and the second dielectric layer 17 formed on the first dielectric layer 16. The groove 18 in which the second intermediate portion 193 is located is extended into the semiconductor layer 12 passing through the first dielectric layer 16 and the second dielectric layer 17. With this structure, the distance from the second intermediate section 193 to the strong electric field region is closer, and the effect of modulation to the strong electric field is further enhanced.

Figure 7:
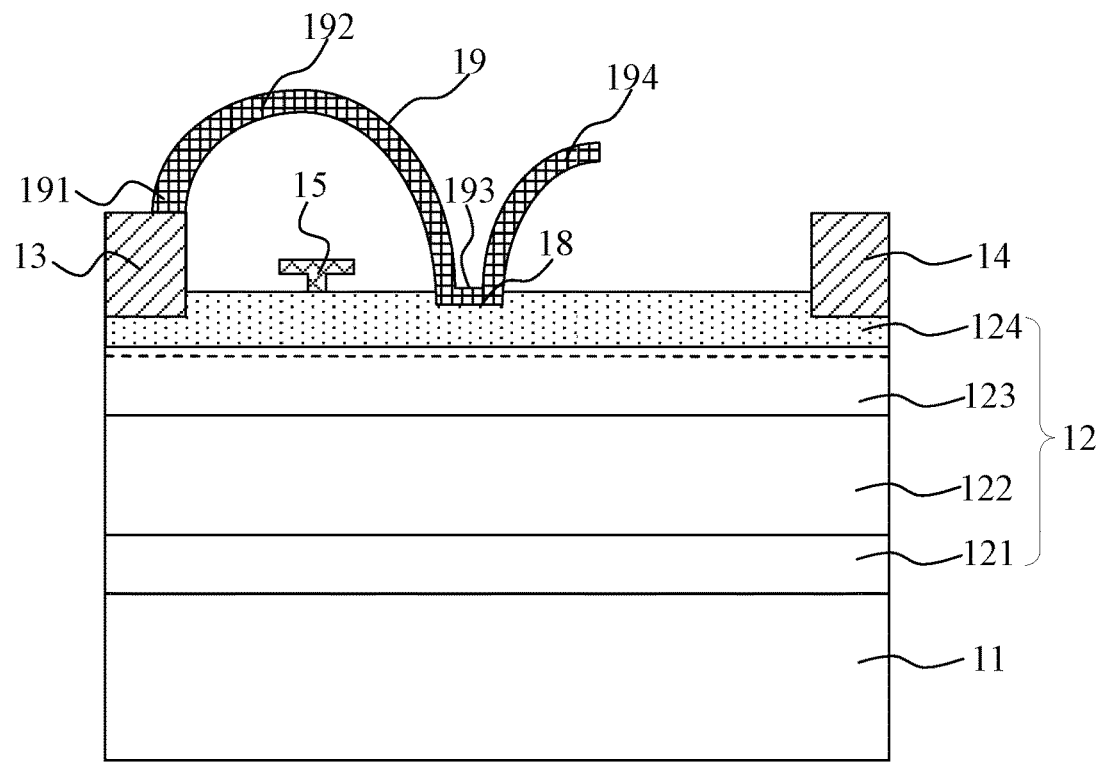

Alternatively, the semiconductor device does not include the dielectric layer. In this case, as shown in FIG. 7, the groove 18 is located in the barrier layer 124, i.e., in the semiconductor layer 12. Compared with the embodiment shown in FIG. 6, the dielectric layer including the first dielectric layer 16 and the second dielectric layer 17 is omitted, it means that a portion of the dielectric layer on the gate region, the source-gate region and a part of the gate-drain region is replaced with air having the same thickness, which can further reduce the parasitic capacitance and the parasitic resistance. Meanwhile, the groove 18 is etched in the barrier layer 124, thus the second intermediate portion 193 located in the groove 18 is closer to the strong field region, compared with the embodiment shown in FIG. 4, therefore the electric field in the region between the gate electrode 15 and the drain electrode 14 can be modulated more effectively.

Of course, although not shown, according to teaching from the embodiments shown in FIGS. 6 and 7, those skilled in the art can appreciate a case where the second dielectric layer 17 is omitted but the first dielectric layer 16 is remained on the basis of the embodiment shown in FIG. 6.

In the semiconductor devices shown in FIGS. 4-7, by forming the groove 18, the distance from the second intermediate portion 193 of the source field plate 19 to the strong electric field region is shorter, which enables effective modulation to the electric field, increase of the breakdown voltage and reduction of the leak current.

The groove 18 may be etched by an air bridge self-aligned lithography and etching process, which will be described in detail later. With this process, the position of the groove 18 with respect to the semiconductor layer 12 is automatically aligned with the positions of the source field plate 19 and the gate source 15, which avoids alignment deviation caused by a separate lithography process forming the groove 18, thus improves yield and reduces manufacture costs.

Figure 8:
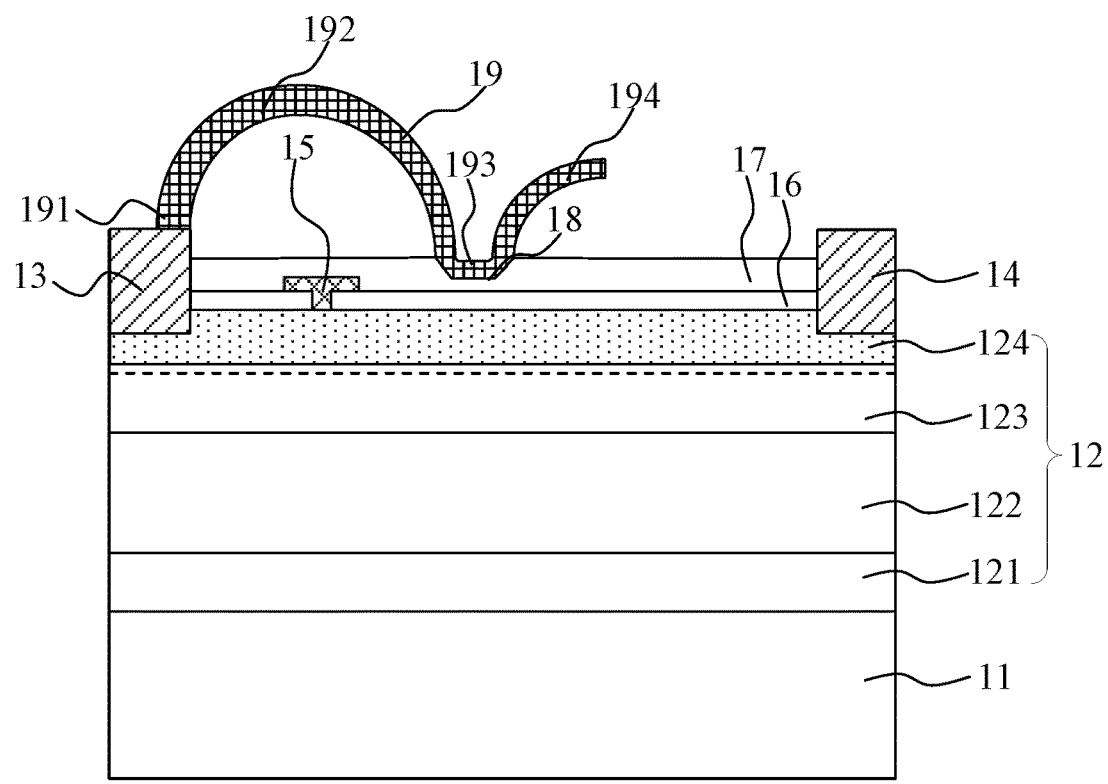
Figure 9:
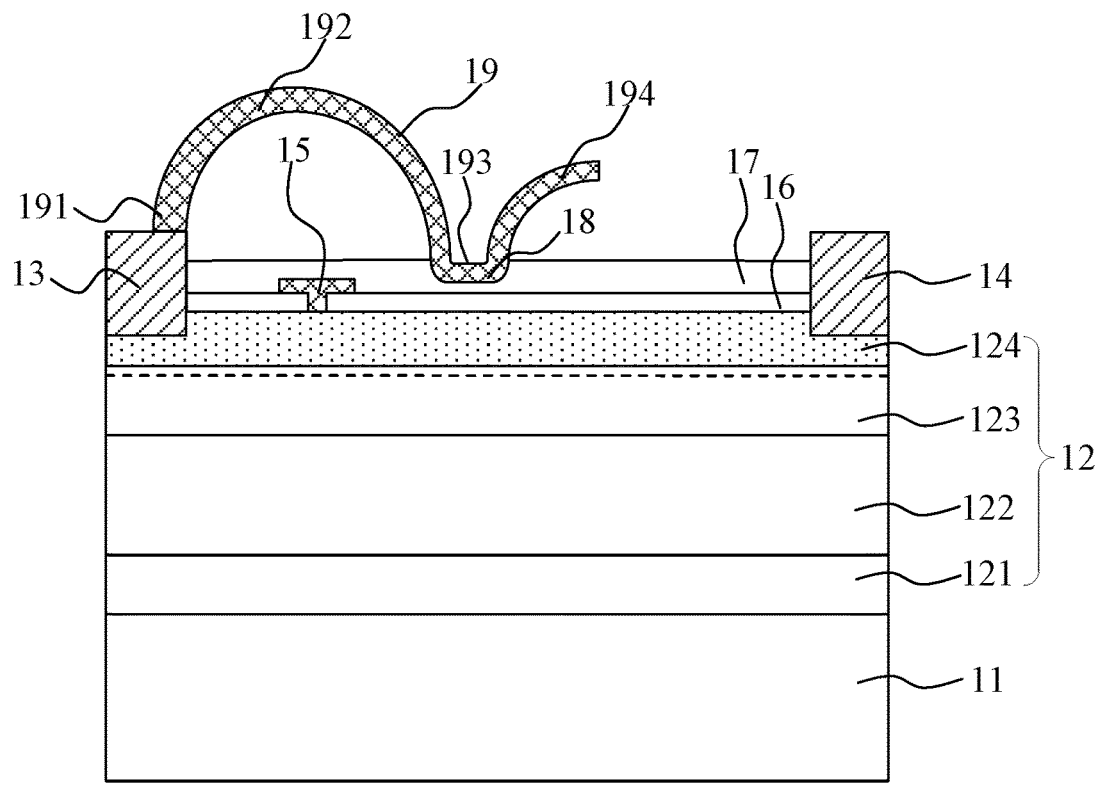

FIGS. 8 and 9 are cross-sectional views schematically illustrating semiconductor devices according other exemplary embodiments of the present invention. Each of the semiconductor devices shown in FIGS. 8 and 9 is substantially the same as that shown in FIG. 4, except for shape of the second intermediate portion 193, thus repeated description will be omitted.

As shown in FIG. 8, in this embodiment, a side wall of the groove 18 has a shape of an inclined surface, rather than a steep surface shown in FIG. 4. With this structure, electric field concentration effect occurring at a corner between the side wall and the bottom surface of the groove 18 can be reduced, and the breakdown electric field at the position can be reduced also. The specific tilt angle can be determined based on device design requirements and process capability.

Alternatively, as shown in FIG. 9, the side wall of the groove 18 has a shape of a curved surface. In this way, the transition between the side wall and the bottom surface of the groove 18 will be smoother compared with the embodiment shown in FIG. 8, thus the electric field concentration effect occurring at the corner between the side wall and the bottom surface of the groove 18 can be further reduced, and the breakdown electric field at the position can be further reduced also. The specific shape of the curved surface can be determined based on device design requirements and process capability.

Figure 10:
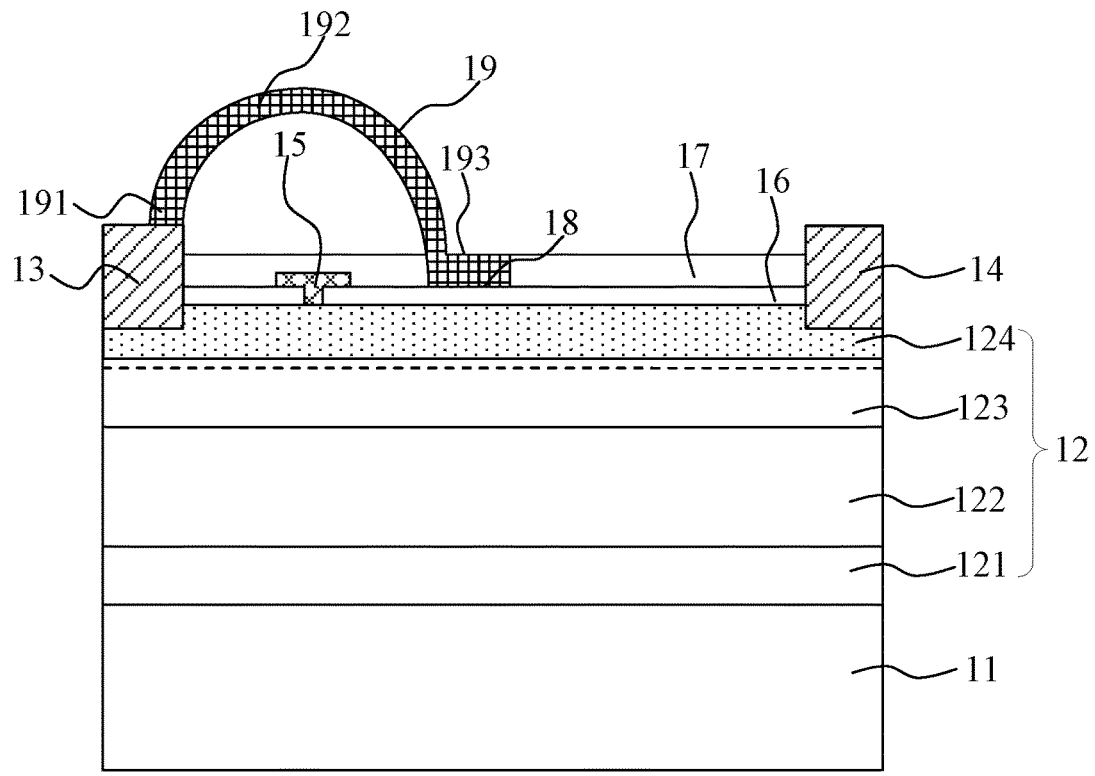

FIG. 10 is a cross-sectional view schematically illustrating a semiconductor device according to still another exemplary embodiment of the present invention. The semiconductor device shown in FIG. 10 is substantially the same as that shown in FIG. 4, except for shape of the source field plate 19, thus repeated description will be omitted.

As shown in FIG. 10, in this embodiment, if the intensity of the electric field inside the semiconductor device is not very high, the length of the end portion 194 of the source field plate 19 may be reduced to about zero, so as to substantially eliminate the parasitic gate-source capacitance and the parasitic resistance due to the end portion 194 of the source field plate 19.

Figure 11:
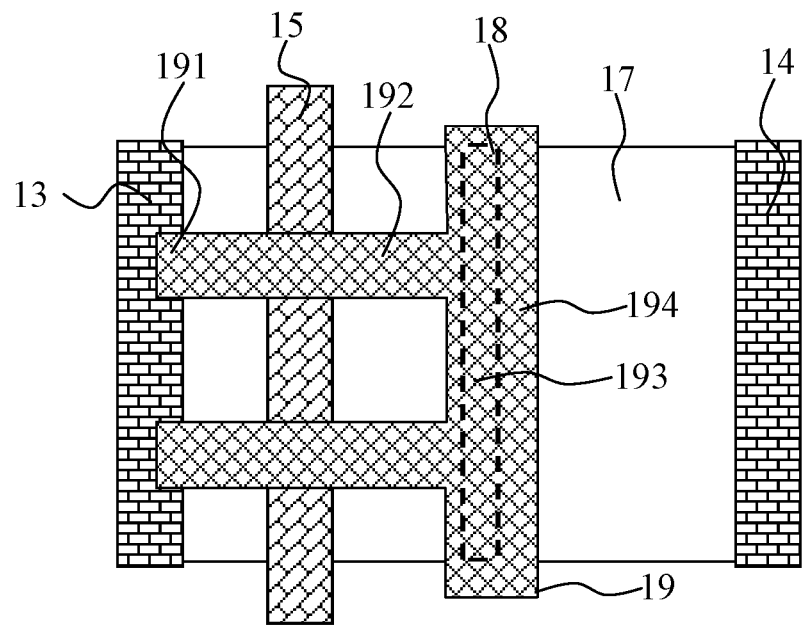
FIG. 11 is a plan view schematically illustrating the semiconductor device shown in any of FIGS. 4-10.

FIG. 11 is a plan view schematically illustrating the semiconductor device shown in any of FIGS. 4-10.

As shown in FIG. 11, the source field plate 19 has a fork-like structure, i.e. there are a plurality of first intermediate portions 192 branching off from the second intermediate portion 193. In particular, there are a plurality of start portions 191 and a plurality of first intermediate portions 192, each of the plurality of start portions 191 and each of the plurality of first intermediate portions 192 form an integral part respectively. The source field plate 19 comprise a plurality of such integral parts, and all of the integral parts are connected to the same second intermediate portion 193, so as to form a fork-like structure. With this structure, the overlapping area between the source field plate 19 and the gate electrode 15 as well as the 2DEG channel may be decreased, which further reduces the parasitic gate-source capacitance and the parasitic resistance. The number and structure of the integral parts can be determined based on device design requirements and process capability.

Figure 12:
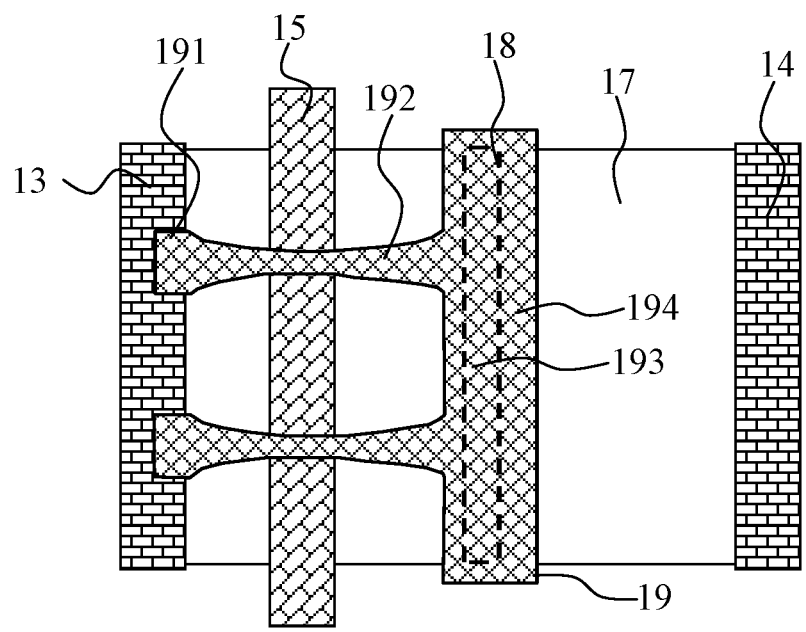
FIG. 12 is a plan view schematically illustrating a semiconductor device according to a modified embodiment of FIG. 11.

FIG. 12 is a plan view schematically illustrating a semiconductor device according to a modified embodiment of FIG. 11.

As shown in FIG. 12, at least one of the plurality of first intermediate portions 192 has a concave shape in the longitudinal direction thereof, which further decreases the overlapping area between the source field plate 19 and the gate electrode 15 as well as the 2DEG channel, and further reduces the parasitic gate-source capacitance and the parasitic resistance.

Those skilled in the art can appreciate that the embodiments shown in FIGS. 11 and 12 are examples only, and are not intended to limit the scope of this invention. For example, in the embodiments shown in FIGS. 11 and 12, the grooves 18 can be omitted. In this case, the second intermediate portion 193 of the source field plate 19 can be directly located on the semiconductor layer 12 or the dielectric layer.

In the semiconductor devices shown in FIGS. 2 to 12, the maximum height difference between the source field plate 19 and the semiconductor layer 12 may be in a range of about 0.5 µm to about 5 µm.

In addition, in the semiconductor devices shown in FIGS. 2 to 9, 11 and 12, the length of the end portion 194 of the source field plate 19 may be greater than about 0 µm and less than or equal to about 5 µm. Herein, the length of the end portion 194 of the source field plate 19 means the longitudinal length of the projection of the end portion 194 on the semiconductor layer 12 or the dielectric layer.

Next, a method of manufacturing a semiconductor device will be described with reference to FIGS. 13a-13e.

FIGS. 13a-13e are cross-sectional views schematically illustrating steps of a method of manufacturing the semiconductor device shown in FIG. 4.

Figure 13A:
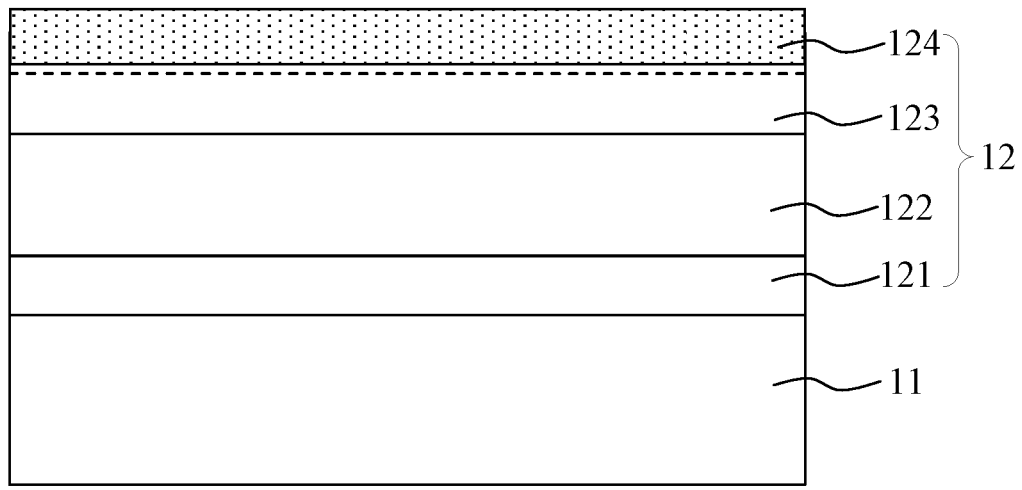
FIGS. 13a-13e are cross-sectional views schematically illustrating steps of a method of manufacturing the semiconductor device shown in FIG. 4.

First, as shown in FIG. 13a, a semiconductor layer 12 is formed on a prepared substrate 11.

In particular, a nucleation layer 121, a buffer layer 122, a channel layer 123 and a barrier layer 124 are sequentially formed on the substrate 11. Here, the channel layer 123 and the barrier layer 124 form a heterojunction structure, and 2DEG is formed at an interface of the heterojunction structure.

Figure 13B:
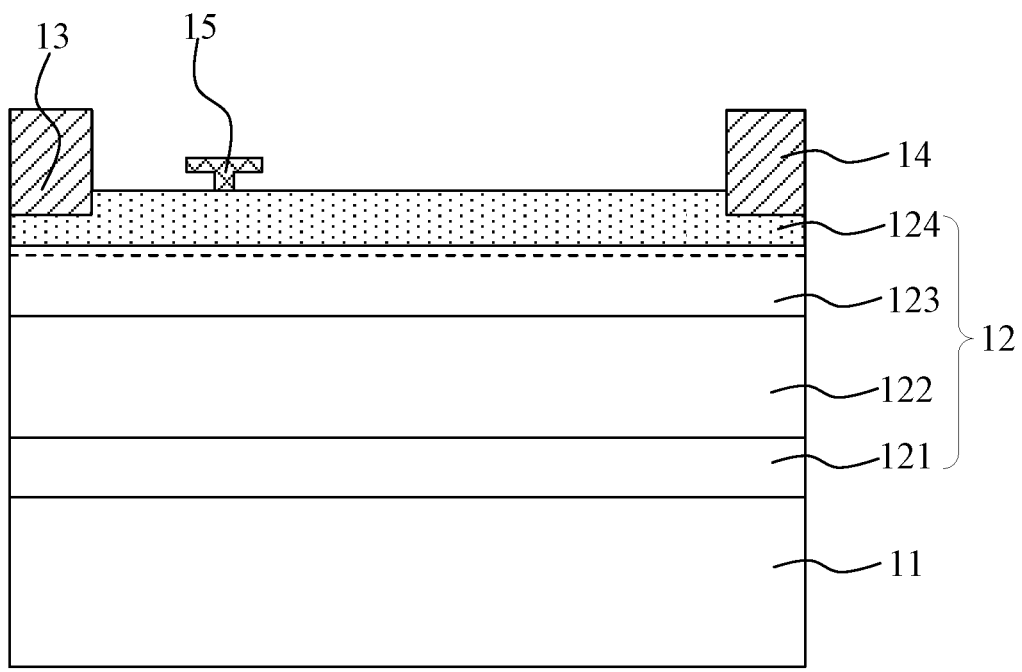

Next, referring to FIG. 13b, a source electrode 13, a drain electrode 14 and a gate electrode 15 between the source electrode 13 and the drain electrode 14 are formed on the semiconductor layer 12.

The source electrode 13 and the drain electrode 14 are in contact with the 2DEG at the interface of the heterojunction structure. The source electrode 13 and the drain electrode 14 can be formed using one of a high temperature annealing method, a heavy doping method and an ion implantation method.

Figure 13C:
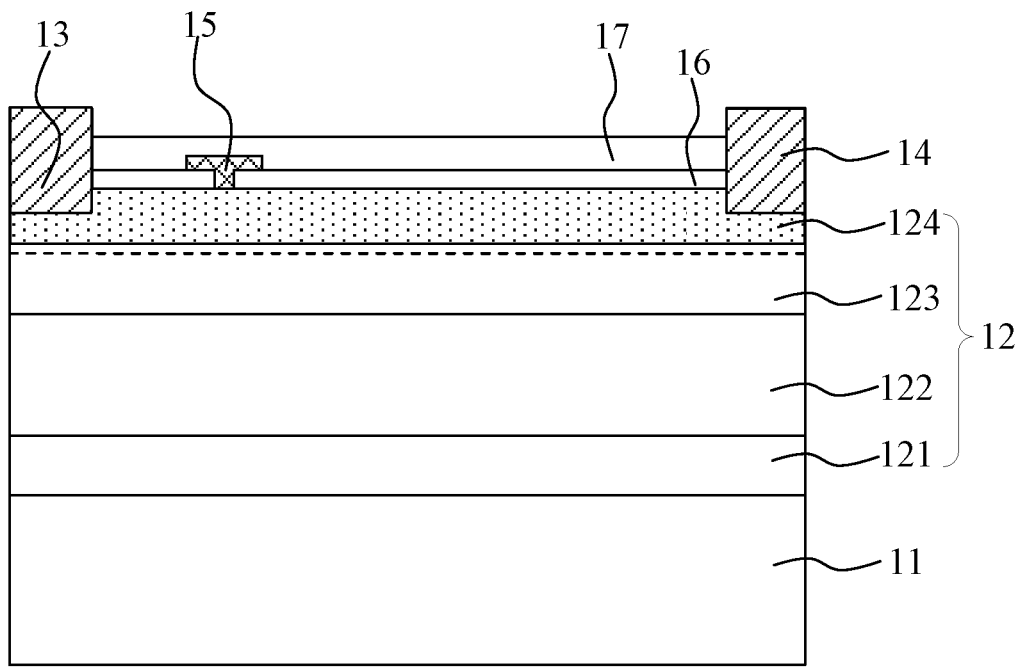

Next, referring to FIG. 13c, a dielectric layer is formed on the semiconductor layer 12.

The dielectric layer may include a first dielectric layer 16 formed on the semiconductor layer 12 and a second dielectric layer 17 formed on the first dielectric layer 16. In particular, the first dielectric layer 16 is formed on a part of the barrier layer 124 between the source electrode 13 and the gate electrode 15 and another part of the barrier layer 124 between the gate electrode 15 and the drain electrode 14. The second dielectric layer 17 is formed on the gate electrode 15 and the first dielectric layer 16. The dielectric layer may be formed using a dielectric layer depositing process. The dielectric layer acts as passivation and protection for the surface of the device, and may be formed of any one selected from SiN, $SiO_2$, SiON, $Al_2O_3$, $HfO_2$, HfAlOx and combination thereof.

The thickness of the first dielectric layer 16 and the second dielectric layer 17 can be determined and adjusted based on the device design requirements.

Figure 13D:
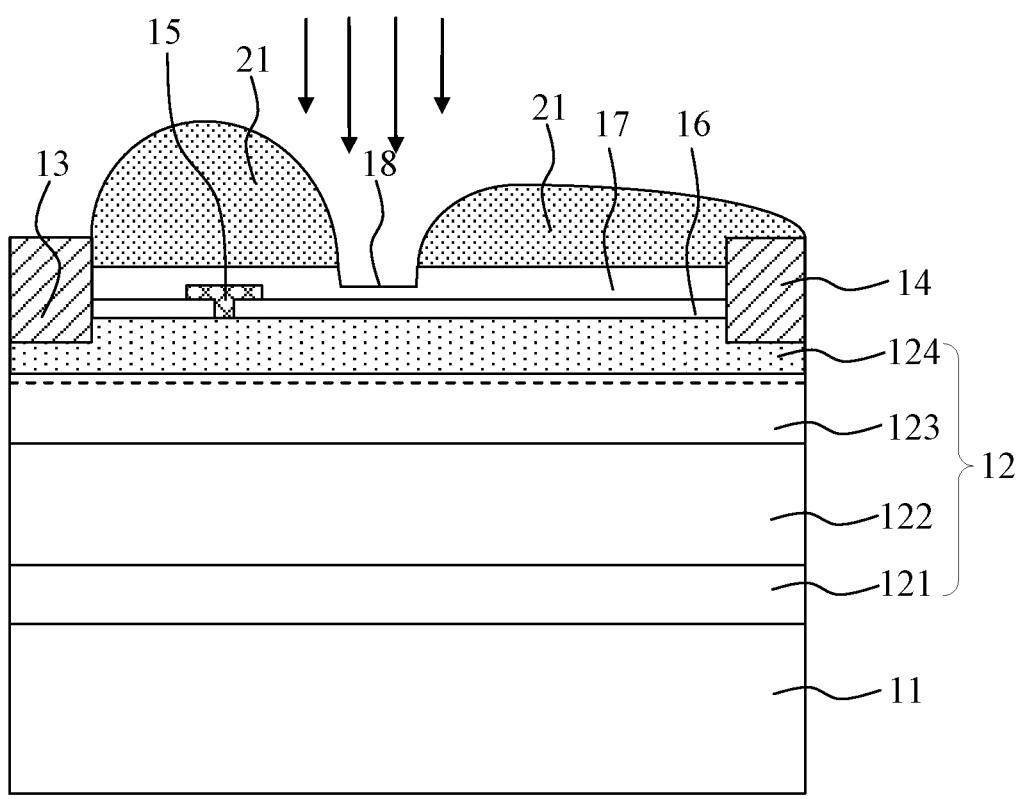

Next, referring to FIG. 13d, a groove 18 is formed in the dielectric layer using an air bridge self-aligned lithography and etching process.

In particular, two photoresist arch structures 21 which are spaced apart from each other are formed in a source-drain region, i.e. between the source electrode 13 and the drain electrode 14, of the device using an air bridge layout design and an air bridge lithography process. Then, etching process is performed directly to the dielectric layer, with the two photoresist arch structures 21 as a mask, so as to form the groove 18 between the two photoresist arch structures 21. After completion of the etching process, the two photoresist arch structures 21 are remained. The process described above is referred as the air bridge self-aligned lithography and etching process. With such a process, the position of the groove 18 with respect to the semiconductor layer 12 is automatically aligned with the positions of the source field plate 19 and the gate source 15, which avoids alignment deviation caused by a separate lithography process forming the groove 18, thus improves yield and reduces manufacture costs.

A width and a depth of the groove 18 as well as a distance between the gate electrode 15 and the groove 18 can be determined and adjusted based on the device design requirements.

Figure 13E:
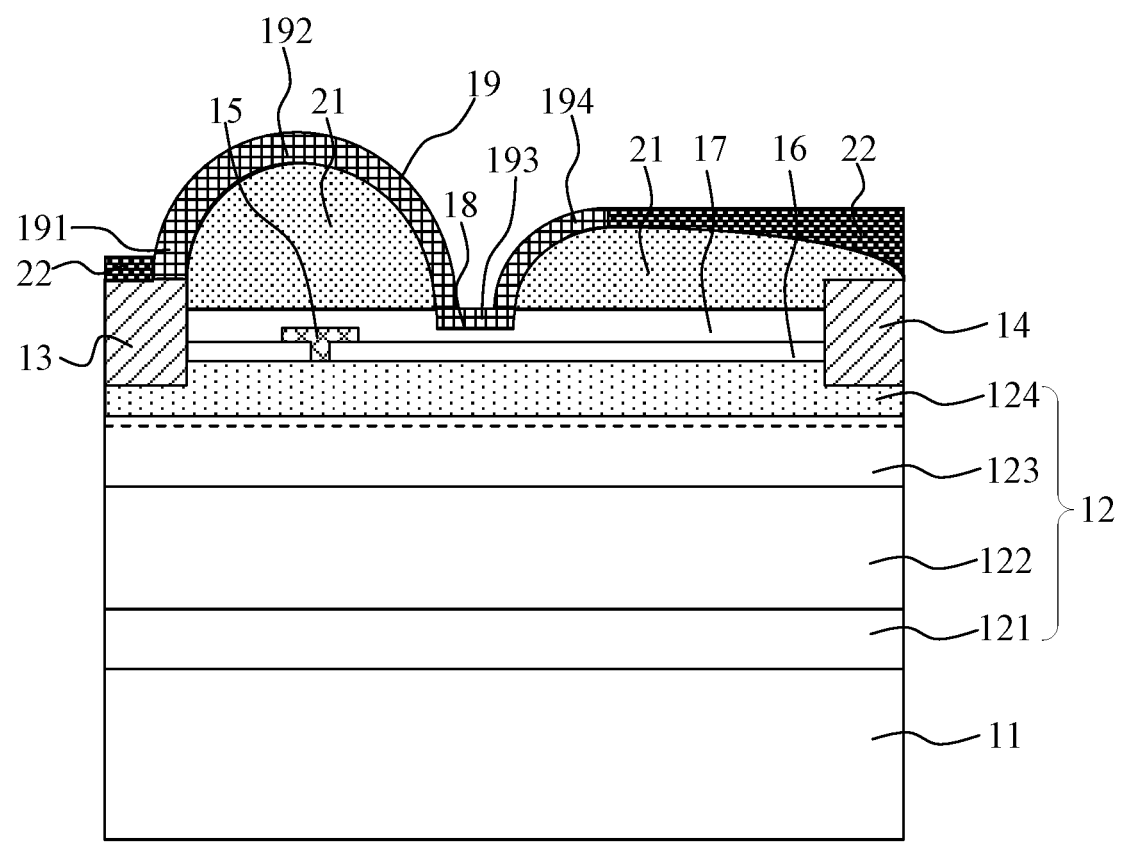

Finally, referring to FIG. 13e, a source field plate 19 is formed using an air bridge metal process.

The source field plate 19 sequentially comprises a start portion 191 electrically connected to the source electrode 13, a first intermediate portion 192 formed on the second dielectric layer 17 with air therebetween, a second intermediate portion 193 contacting a portion of the second dielectric layer 17 between the gate electrode 15 and the drain electrode 14, and an end portion 194 formed on the second dielectric layer 17 with air therebetween.

After forming the groove 18, photoresist 22 is formed on the source electrode 13, the drain electrode 14 and the two photoresist arch structures 21 using a lithography process, so as to define a coverage area of the source field plate 19. Then, the source field plate 19 is formed on the area not covered by the photoresist 22 using one or combination of a metal electron beam evaporation process, a metal sputtering process and a metal plating process, with metal as the material. The source field plate 19 covers the groove 18. The thickness and shape of the source field plate 19 can be determined and adjusted based on device design requirements or process capacity. Finally, the two photoresist arch structures 21 and the photoresist 22 are removed, so as to form the source field plate 19 having a projection which can be received in the groove 18.

If the source field plate 19 is too close to the dielectric layer, the parasitic capacitance and the parasitic resistance will be increased. In other hand, if the source field plate 19 is too far from the dielectric layer, reliability of the air bridge structure will be affected. Thus a length, a thickness and a distance to the surface of the dielectric layer can be determined and adjusted based on the device design requirements.

In one embodiment, the maximum height difference between the source field plate 19 and the semiconductor layer 12 may be in a range of about 0.5 µm to about 5 µm.

In addition, the length of the end portion 194 of the source field plate 19 may be greater than about 0 µm and less than or equal to about 5 µm.

A method for manufacturing the semiconductor device shown in FIG. 4 has been described as an example. Those skilled in the art will appreciate that the above-described method can be adjusted to manufacturing a semiconductor device according to another embodiment. For example, in the case of only the first dielectric layer 16, the step of forming the second dielectric layer 17 can be omitted, the grooves 18 can be formed in the first dielectric layer 16, or alternatively be formed in the semiconductor layer 12 passing through the first dielectric layer 16. In the case of no dielectric layer, the step of forming the dielectric layer may be omitted, and the groove 18 may be formed directly in the semiconductor layer 12. And in this case, the source field plate 19 is formed directly on the semiconductor layer 12.

As another example, in the case of no groove, the step of forming the groove 18 can be omitted. In this case, if the dielectric layer comprises both of the first dielectric layer 16 and the second dielectric layer 17, the second intermediate portion 193 of the source field plate 19 can be in direct contact with the second dielectric layer 17. If the dielectric layer comprises the first dielectric layer 16 only, the second intermediate portion 193 of the source field plate 19 can be in direct contact with the first dielectric layer 16. In contrast, if there is no dielectric layer, the second intermediate portion 193 of the source field plate 19 may be in direct contact with the semiconductor layer 12.

In an embodiment of the present invention, at least one of a gate field plate, a drain field plate and a floating field plate may be formed on the dielectric layer, so as to further increase the breakdown voltage of the semiconductor device.

In the above-described manufacturing method, the groove 18 is formed using the air bridge self-aligned lithography and etching process. With such a process, the position of the groove 18 with respect to the semiconductor layer 12 is automatically aligned with the positions of the source field plate 19 and the gate source 15, which avoids alignment deviation caused by a separate lithography process forming the groove 18, thus improves yield and reduces manufacture costs. Of course, the air bridge self-aligned lithography and etching process is taken as an example only and is not intended to limit the scope of the present invention.

It should be understood that the embodiments described herein should be considered in a descriptive sense only and not for purposes of limitation. Descriptions of features or aspects within each embodiment should typically be considered as available for other similar features or aspects in other embodiments.

While embodiments of the present invention have been described with reference to the figures, it will be understood by those of ordinary skill in the art that various changes in form and details may be made therein without departing from the spirit and scope of the present invention as defined by the following claims and their equivalents.

What is claimed is:
1. A semiconductor device, comprising:
a substrate;
a semiconductor layer formed on the substrate;
a first dielectric layer formed on the semiconductor layer;
a second dielectric layer formed on the first dielectric layer and a groove formed in the second dielectric layer;

a source electrode, a drain electrode and a gate electrode between the source electrode and the drain electrode formed on the semiconductor layer; and an integrated source field plate formed on the semiconductor layer, in a direction from the source electrode to the drain electrode, the source field plate sequentially comprising:
- a start portion electrically connected to the source electrode;
- a first intermediate portion spaced apart from the second dielectric layer with air therebetween, the first intermediate portion being directly connected to the start portion;
- a second intermediate portion disposed between the gate electrode and the drain electrode in a horizontal direction, without air between the second intermediate portion and the second dielectric layer, the second intermediate portion being directly connected to the first intermediate portion; and
- an end portion spaced apart from the second dielectric layer and the drain electrode with air therebetween, the end portion being directly connected to the second intermediate portion, wherein an orthographic projection of the second intermediate portion of the source field plate is located in the groove, other portions of the source field plate except the second intermediate portion are spaced from the second dielectric layer, and the second intermediate portion is in direct contact with the bottom surface of the groove.

2. The semiconductor device according to claim 1, wherein the second intermediate portion of the source field plate is in direct contact with the second dielectric layer.

3. The semiconductor device according to claim 1, wherein the groove is formed in a position corresponding to the second intermediate portion of the source field plate in the horizontal direction, and the end portion of the source field plate is in the air.

4. The semiconductor device according to claim 3, further comprising a first dielectric layer formed on the semiconductor layer and a second dielectric layer formed on the first dielectric layer,
wherein the groove is formed in the second dielectric layer.

5. The semiconductor device according to claim 3, wherein a side wall of the groove has a shape of any one of a linear surface, an inclined surface and a curved surface or combination thereof.

6. The semiconductor device according to claim 1, wherein the source field plate comprises a plurality of start portions and a plurality of first intermediate portions, each of the plurality of start portions and each of the plurality of first intermediate portions form an integral part respectively, the plurality of the first intermediate portions branch off from a same second intermediate portion.

7. The semiconductor device according to claim 6, wherein at least one of the first intermediate portions has a concave shape in a longitudinal direction of the source field plate.

8. The semiconductor device according to claim 1, wherein the end portion of the source field plate has a length greater than about 0 μm and less than or equal to about 5 μm.

9. The semiconductor device according to claim 1, wherein a maximum height difference between the source field plate and the semiconductor layer is in a range of about 0.5 μm to about 5 μm.

10. A method of manufacturing a semiconductor device, comprising:
forming a semiconductor layer on a prepared substrate;
forming a first dielectric layer on the semiconductor layer;
forming a second dielectric layer on the first dielectric layer;
forming a groove in the second dielectric layer;
forming a source electrode, a drain electrode and a gate electrode between the source electrode and the drain electrode on the semiconductor layer; and
forming an integrated source field plate on the semiconductor layer, in a direction from the source electrode to the drain electrode, the source field plate sequentially comprising:
- a start portion electrically connected to the source electrode;
- a first intermediate portion spaced apart from the second dielectric layer with air therebetween, the first intermediate portion being directly connected to the start portion;
- a second intermediate portion disposed between the gate electrode and the drain electrode in a horizontal direction, without air between the second intermediate portion and the second dielectric layer, the second intermediate portion being directly connected to the first intermediate portion; and
- an end portion spaced apart from the second dielectric layer and the drain electrode with air therebetween, the end portion being directly connected to the second intermediate portion, wherein an orthographic projection of the second intermediate portion of the source field plate is located in the groove, other portions of the source field plate except the second intermediate portion are spaced from the second dielectric layer, and the second intermediate portion is in direct contact with the bottom surface of the groove.

11. The method according to claim 10, wherein the source field plate is formed using an air bridge metal process.

12. The method according to claim 11, wherein the air bridge metal process comprises at least one of a metal electron beam evaporation process, a metal sputtering process and a metal plating process.

* * * * *